United States Patent
Suzuki et al.

(10) Patent No.: US 9,509,303 B2
(45) Date of Patent: Nov. 29, 2016

(54) PRESSURE-SENSITIVE SWITCH, MANUFACTURING METHOD FOR SAME, TOUCH PANEL INCLUDING PRESSURE-SENSITIVE SWITCH, AND MANUFACTURING METHOD FOR TOUCH PANEL

(71) Applicant: Panasonic Intellectual Property Management Co., Ltd., Osaka (JP)

(72) Inventors: Takeshi Suzuki, Osaka (JP); Tetsuyoshi Ogura, Osaka (JP); Aki Yazawa, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 185 days.

(21) Appl. No.: 14/512,462

(22) Filed: Oct. 12, 2014

(65) Prior Publication Data

US 2015/0116073 A1  Apr. 30, 2015

(30) Foreign Application Priority Data

Oct. 30, 2013  (JP) ................. 2013-225710

(51) Int. Cl.
*H01C 10/10* (2006.01)
*H03K 17/96* (2006.01)
*G06F 3/041* (2006.01)

(52) U.S. Cl.
CPC ......... *H03K 17/9647* (2013.01); *G06F 3/0414* (2013.01); *H03K 2017/9613* (2013.01); *H03K 2217/96015* (2013.01); *Y10T 29/49105* (2015.01)

(58) Field of Classification Search
CPC ..... H01H 13/702; H01H 13/88; H01H 13/79
USPC ................... 338/47; 200/512, 600
See application file for complete search history.

(56) References Cited

U.S. PATENT DOCUMENTS

| | | | | |
|---|---|---|---|---|
| 3,830,991 A * | 8/1974 | Durocher | ............... | H01H 3/141 200/86 R |
| 4,017,697 A * | 4/1977 | Larson | ................. | H01H 13/702 200/5 A |
| 6,483,055 B1 * | 11/2002 | Tanabe | ................... | H01H 3/141 200/512 |
| 7,034,808 B2 * | 4/2006 | Sakata | .................... | G06F 3/045 345/173 |
| 7,112,755 B2 * | 9/2006 | Kitano | ...................... | G01L 1/20 200/17 R |
| 7,163,733 B2 * | 1/2007 | Bourdelais | ................ | B32B 3/12 200/512 |
| 7,230,198 B2 * | 6/2007 | Cok | ......................... | G06F 3/045 200/512 |
| 8,310,465 B2 * | 11/2012 | Iwasaki | ................... | G06F 3/045 345/174 |
| 8,624,869 B2 * | 1/2014 | Onaka | .................... | G06F 3/045 200/512 |
| 2006/0131158 A1 * | 6/2006 | Takiguchi | ............ | H01H 13/702 200/512 |
| 2008/0283380 A1 | 11/2008 | Tanabe et al. | | |

FOREIGN PATENT DOCUMENTS

JP  2008-311208  12/2008

* cited by examiner

*Primary Examiner* — Kyung Lee
(74) *Attorney, Agent, or Firm* — Wenderoth, Lind & Ponack, L.L.P.

(57) ABSTRACT

A pressure-sensitive switch includes a first substrate, a conductive structure provided on the first substrate, and an electrode unit disposed to face the first substrate with the conductive structure located therebetween. The conductive structure includes an electrode layer on the first substrate, and an elastic component having conductivity and extending to protrude from the electrode layer toward the electrode unit.

15 Claims, 14 Drawing Sheets

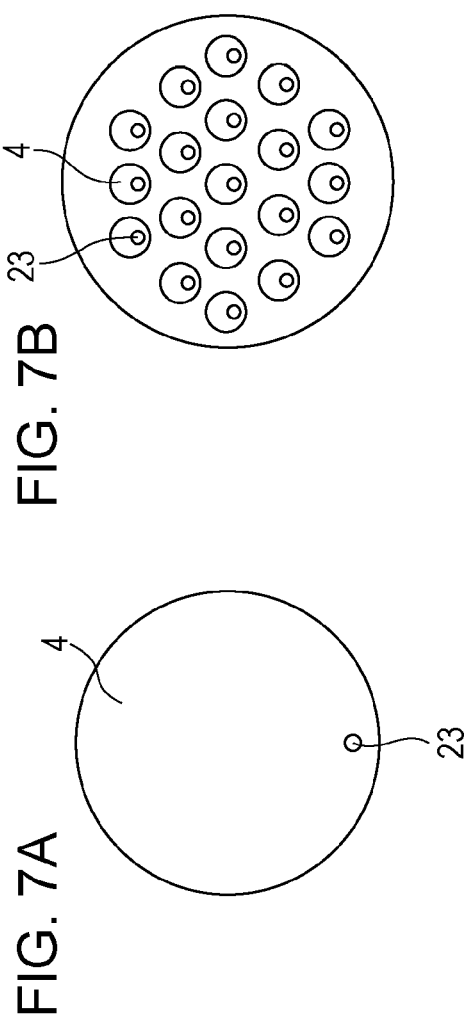
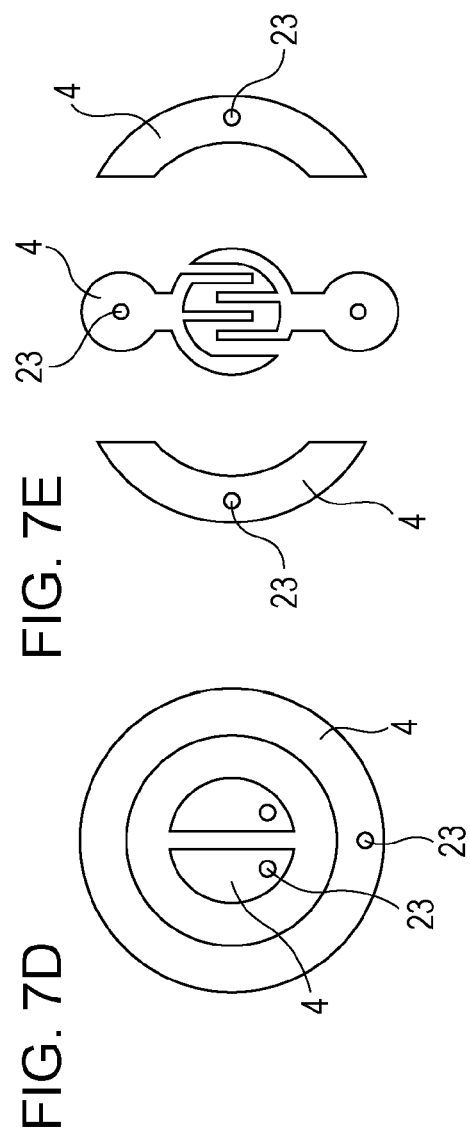
FIG. 7A
FIG. 7B
FIG. 7C
FIG. 7D
FIG. 7E

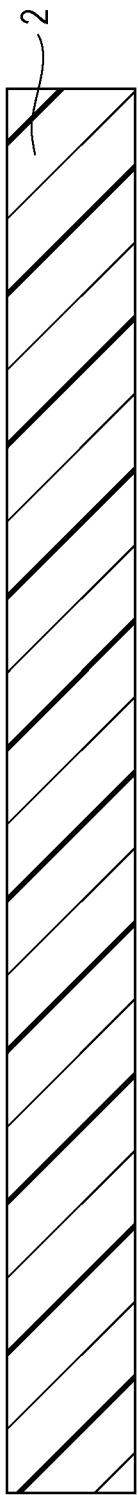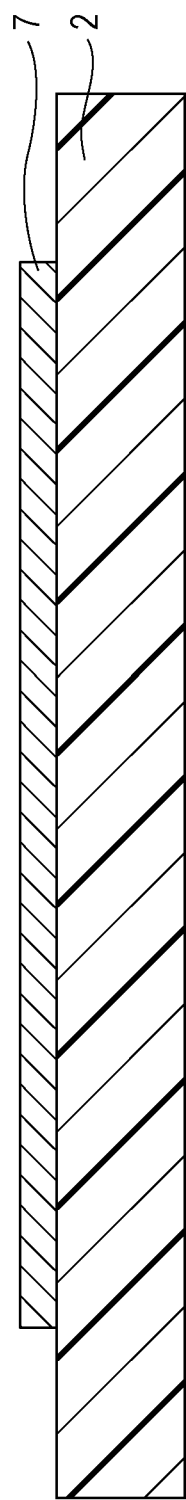

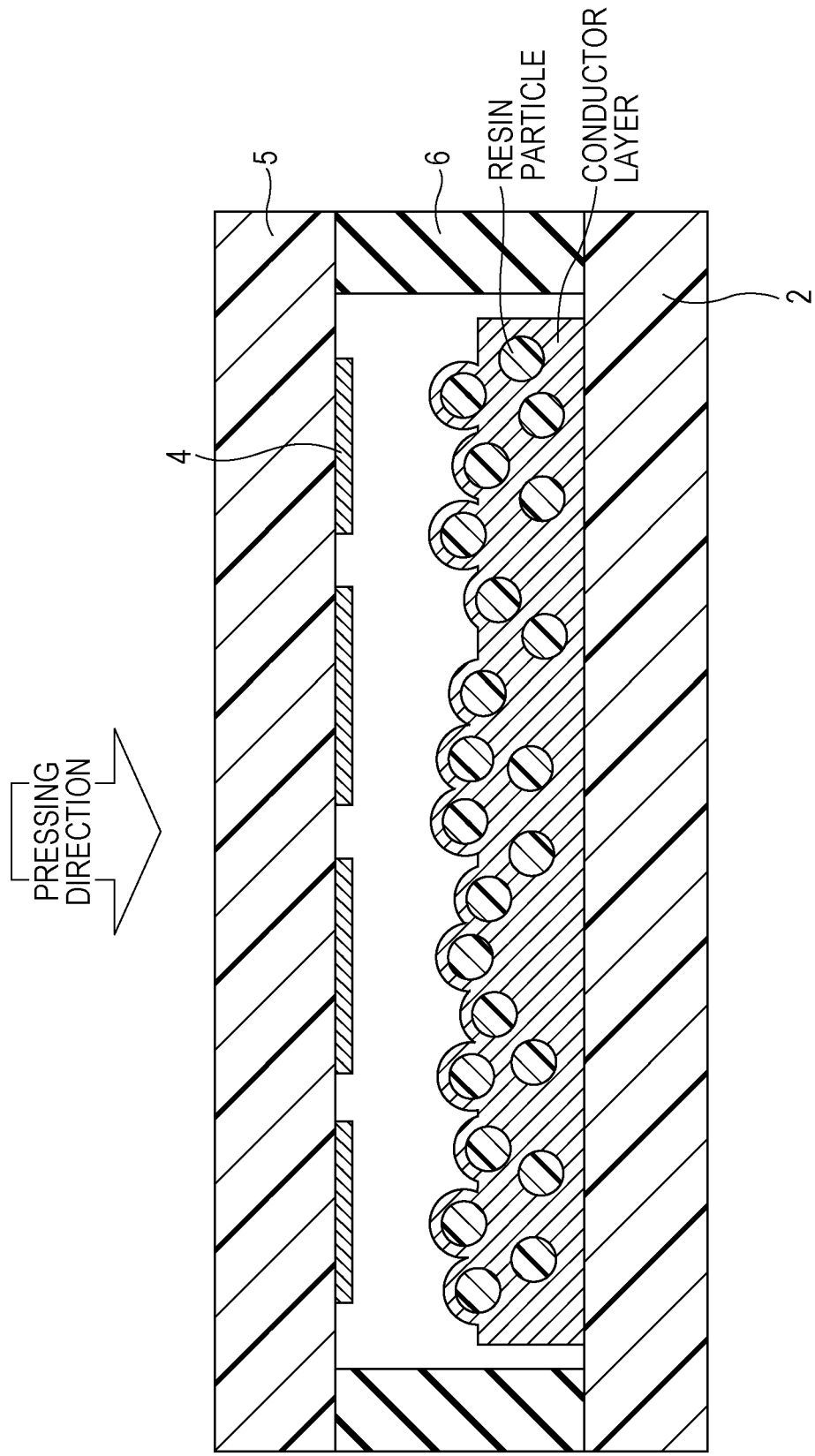

PRESSURE-SENSITIVE SWITCH, MANUFACTURING METHOD FOR SAME, TOUCH PANEL INCLUDING PRESSURE-SENSITIVE SWITCH, AND MANUFACTURING METHOD FOR TOUCH PANEL

BACKGROUND

1. Technical Field

The present disclosure relates to a pressure sensitive switch and a manufacturing method for the pressure-sensitive switch. The present disclosure further relates to a touch panel including the pressure-sensitive switch, and a manufacturing method for the touch panel.

2. Description of the Related Art

An increase in functionality and versatility of various electronic devices, such as smartphones and car navigators, has quickly been progressed in recent years. In such a situation, a pressure-sensitive switch, which is one of component elements of those electronic devices, is also demanded to be reliably operable. A pressure-sensitive switch of related art mainly includes, as illustrated in FIG. 11, a support substrate 2, a conductive structure provided on the support substrate, and a pressing substrate 5 including an electrode unit 4 and disposed above the conductive structure (see Japanese Unexamined Patent Application Publication No. 2008-311208). The electrode unit is connected to an electronic circuit of a device through lead wires, etc.

The conductive structure includes a conductor layer and resin particles in sizes of several tens to several hundreds μm, which are dispersed in the conductor layer. The surface of the conductive structure has a rugged form defined by the resin particles dispersed in the conductor layer.

The pressure-sensitive switch establishes electrical connection when the pressing substrate is pressed and the electrode unit provided on the pressing substrate is brought into contact with the conductor layer having the rugged surface. In the pressure-sensitive switch, when the pressing substrate is further pressed, the resin particles in the conductive structure are deformed and a contact area between the electrode unit and the conductor layer is increased, whereby a resistance value is reduced. Thus, in the pressure-sensitive switch, the applied pressure is sensed from change of the resistance value.

SUMMARY

The present disclosure provides a pressure-sensitive switch, which can reduce variations in change of the resistance value and which can sense the applied pressure with high accuracy, and a manufacturing method for the pressure-sensitive switch.

According to one aspect of the present disclosure, there is provided a pressure-sensitive switch including a first substrate, a conductive structure provided on he first substrate, and an electrode unit disposed to face the first substrate with the conductive structure located therebetween, wherein the conductive structure includes an electrode layer on the first substrate, and an elastic component having conductivity and extending to protrude from the electrode layer toward the electrode unit.

With the one aspect of the present disclosure, variations in change of a resistance value can be reduced, and the applied pressure can be sensed with high accuracy.

BRIEF DESCRIPTION OF THE DRAWINGS

FIGS. 7A to 7E are each a schematic plan view of an electrode unit that is a structural element of the pressure-sensitive switch according to the first embodiment of the present disclosure.

FIGS. 9A to 9E are schematic views illustrating successive steps of a manufacturing method for the pressure-sensitive switch according to the present disclosure.

FIG. 11 is a schematic cross-sectional view of a pressure-sensitive switch of related art.

DETAILED DESCRIPTION (Finding as Basis of Present Disclosure)

Prior to explaining embodiments of the present disclosure, the points studied by the inventors are described.

The pressure-sensitive switch of related art senses the applied pressure from change of the resistance value. In the pressure-sensitive switch of related art, however, because the resin particles exist irregularly inside the conductive structure, shapes of the resin particles are not uniformly deformed when the pressing substrate is pressed. Moreover, in the pressure-sensitive switch of related art, because of variations in physical properties of the resin particles and poor durability, it is difficult to perform control in such a manner that the shapes of the resin particles are uniformly deformed when the pressing substrate is pressed. Therefore, the resistance value tends to vary even when the pressing substrate is pressed by the same pressure. In addition, the resin particles gradually deteriorate wide repeated pressing of the pressing substrate. The inventors have found the fact, that sensitivity of the pressure-sensitive switch may degrade as a result of the above-discussed situation.

On the basis of the above-mentioned finding, the inventors have conceived inventions set forth in the following embodiments of the present disclosure.

Pressure-sensitive switches according to the present disclosure will be described below.

((Pressure-Sensitive Switches According to Present Disclosure))

A pressure-sensitive switch according to a first embodiment of the present disclosure will be first described.

(First Embodiment of Present Disclosure)

Figure 1:
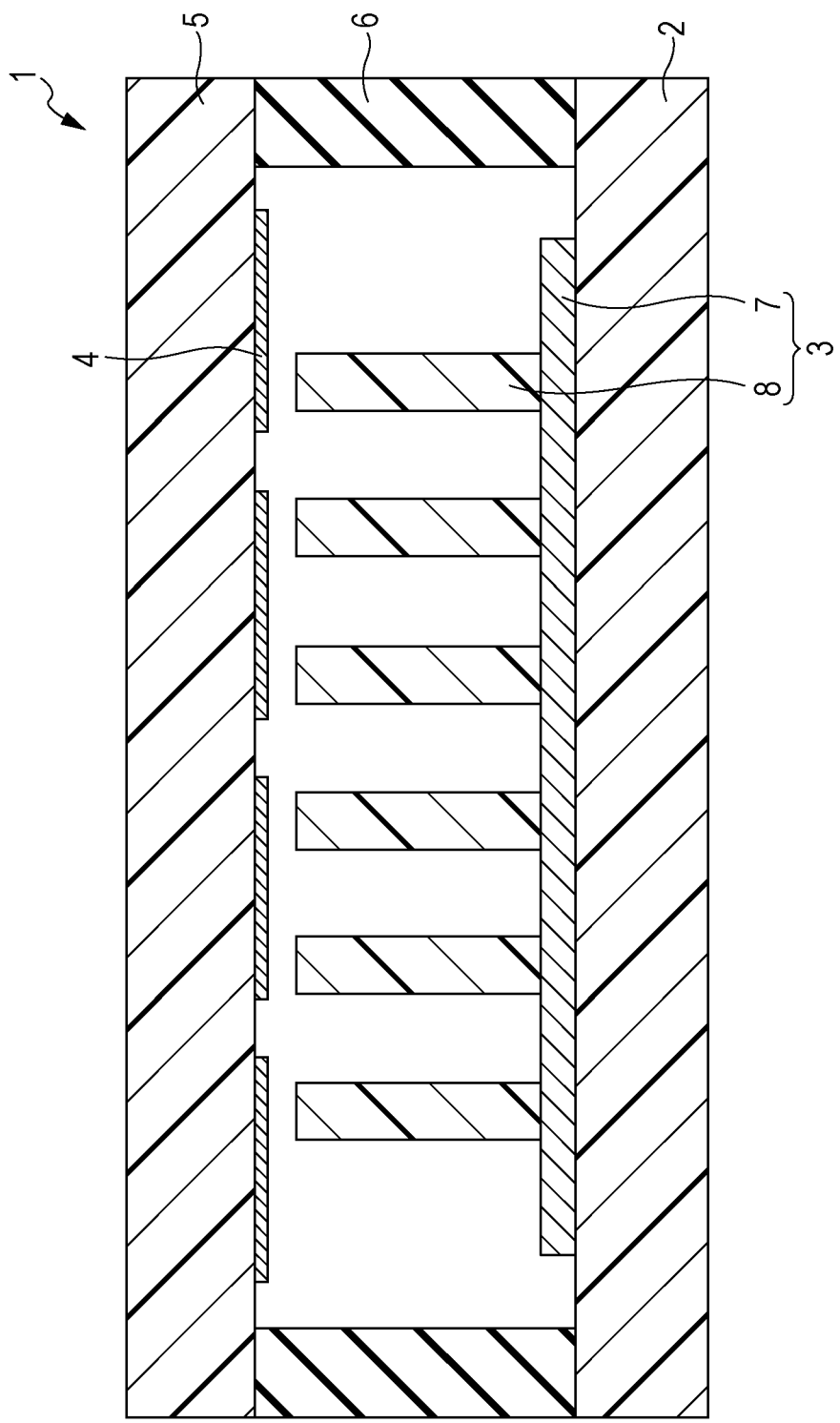
FIG. 1 is a schematic cross-sectional view of a pressure-sensitive switch according to a first embodiment of the present disclosure.

FIG. 1 is a schematic cross-sectional view of a pressure-sensitive switch 1 according to the first embodiment of the present disclosure. As illustrated in FIG. 1, the pressure-sensitive switch 1 includes a support substrate 2, a conductive structure 3 provided on the support substrate 2, and a pressing substrate 5 disposed to face the support substrate 2 with the conductive structure 3 interposed between them. The pressing substrate 5 is provided with a plurality of electrode units 4. More specifically, as illustrated in FIG. 1, the electrode units 4 are disposed on a lower surface of the pressing substrate 5. The pressing substrate 5 includes preferably a least two electrode units 4 The pressing substrate 5 is disposed to face the support substrate 2 with a spacer 6 interposed between them, the spacer 6 being disposed on a peripheral edge of the support substrate 2. The spacer 6 is made of insulating resin, such as a polyester resin or an epoxy resin. In the arrangement expressed by "with the conductive structure 3 interposed between them", it is enough that the conductive structure 3 exists between the support substrate 2 and the pressing substrate 5. Thus, the conductive structure 3 is not always required to be contacted with the support substrate 2 and the pressing substrate 5. Preferably, the support substrate 2 has flexibility. Here, the expression "the support substrate 2 has flexibility" implies that, when the pressing substrate 5 is pressed, the support substrate 2 is distorted into a convex shape protruding along a pressing direction. The support substrate 2 is made of, though not being particularly limited to, plastic such as polyethylene terephthalate, polycarbonate, or polyimide. Because the support substrate 2 has flexibility, the support substrate 2 can be disposed in a device having a three dimensional structure as well. The pressing substrate 5 also has flexibility similarly to the support substrate 2. A thickness of the support substrate 2 is, e.g., 25 to 500 μm in consideration of durability and reduction in thickness of the pressure-sensitive switch. The conductive structure 3 includes an electrode layer 7 disposed on the support substrate 2, and a plurality of elastic components 8 extending to protrude from the electrode layer 7 substantially perpendicularly in a direction toward the electrode units 4, which are provided on the pressing substrate 5. In practice, the expression "extending to protrude from the electrode layer 7 substantially perpendicularly in a direction toward the electrode units 4" implies that the elastic components 8 protrude from the electrode layer 7 in the direction toward the electrode units 4 at angle in the range of 60 to 90 degrees, for example, 70 to 90 degrees.

Figure 8A:
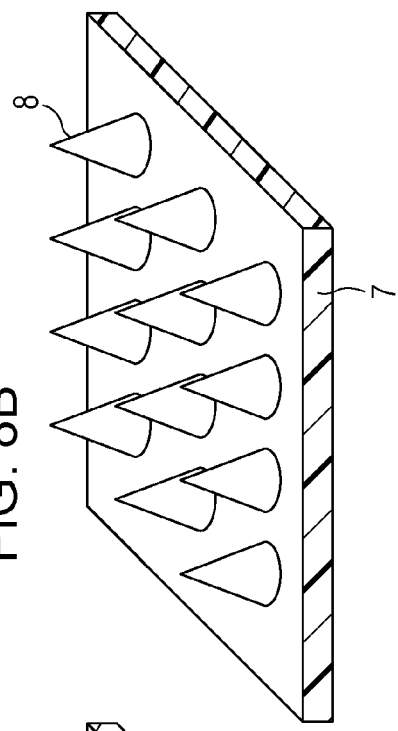
FIGS. 8A to 8D are each a schematic perspective view illustrating an elastic component that is a structural element of the pressure-sensitive switch according to the present disclosure.
Figure 8B:
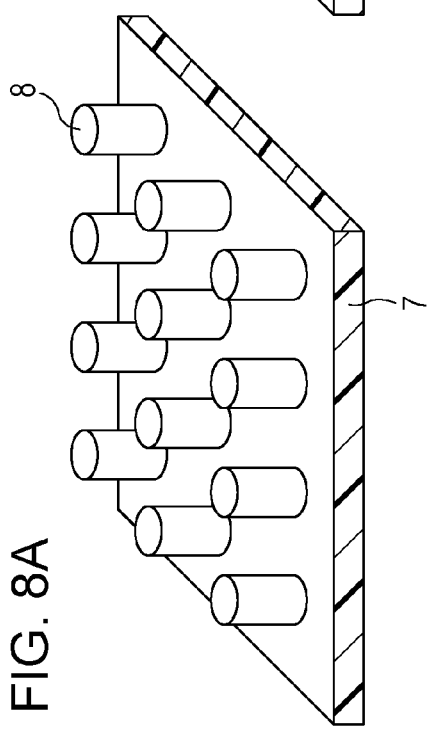

The expression "a plurality of elastic components 8 extending to protrude from the electrode layer 7 substantially perpendicularly in a direction toward the electrode units 4, which are provided on the pressing substrate 5" implies a plurality of elastic components 8 each locally provided in a pillar shape on the electrode layer 7, or a plurality of elastic components 8 each formed in a projecting shape on the electrode layer 7. More specifically, the elastic components 8 are each provided on the electrode layer 7 such that one end of the elastic component 8 is substantially fixed to the electrode layer 7. The plural elastic components 8 are provided on the electrode layer 7 in spaced relation from each other at intervals. As described later, when the pressing substrate 5 is pressed, shapes of the elastic components 8 corresponding to a pressed region of the pressing substrate 5 are uniformly deformed due to elastic properties thereof. Furthermore, as illustrated in FIG. 1, the elastic components 8 are provided on the electrode layer 7 in a regular fashion. Stated in another way, the elastic components 8 are provided on the electrode layer 7 in states of being the same in shape, material, and size. While the shape of the elastic component 8 is not limited to particular one, it preferably has a columnar structure as illustrated in FIG. 8A, or a conical structure as illustrated in FIG. 8B.

Figure 12A:
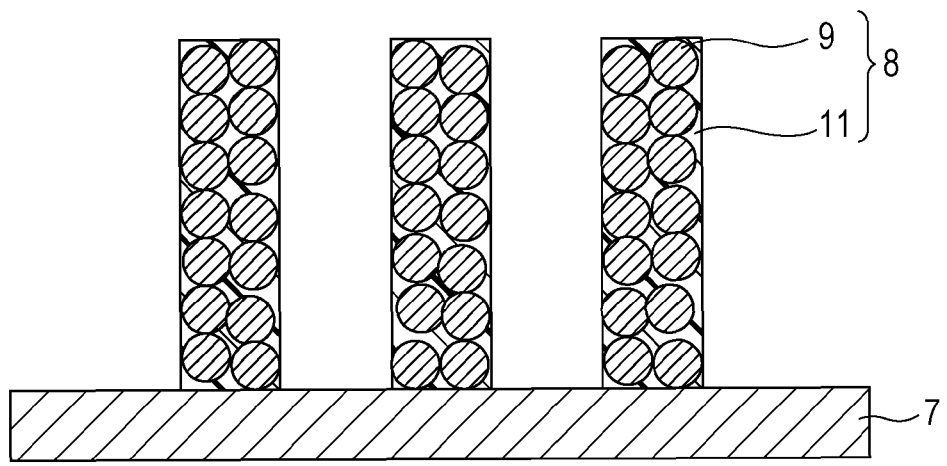
FIGS. 12A and 12B are each an enlarged schematic cross-sectional view of an elastic component that is a structural element of a pressure-sensitive switch according to the present disclosure.

Each of the elastic components 8 has "conductivity". In one example, as illustrated in FIG. 12A, the elastic component 8 includes a resin structure 11 and conductive fillers 9 uniformly present in the resin structure 11. The resin structure 11 is made of, e.g., a urethane resin, a silicone based resin such as polydimethylpolysiloxane (PDMS), or a styrene resin, each having an elastic property. The conductive fillers 9 are made of a material selected from a group including Au, Ag, Cu, C, ZnO, $In_2O_3$, $SnO_2$, etc. As described later, when the pressing substrate 5 is pressed, the shapes of the elastic components 8 each corresponding to a pressed region of the pressing substrate 5 are uniformly deformed due to the elastic properties thereof. At that time, when the elastic component 8 is deformed and its height is reduced, the conductive fillers 9 inside the elastic component 8 are contacted with each other. Thus, the elastic component 8 is brought into an electrically conductible state. With the mutual contact of the conductive fillers 9 present inside the elastic component 8, a contact area between the conductive fillers 9 changes. Accordingly, conductivity of the elastic component 8 also changes, whereby sharper change can be obtained in a later-described resistance value between the electrode unit(s) 4 and the electrode layer 7.

Figure 12B:
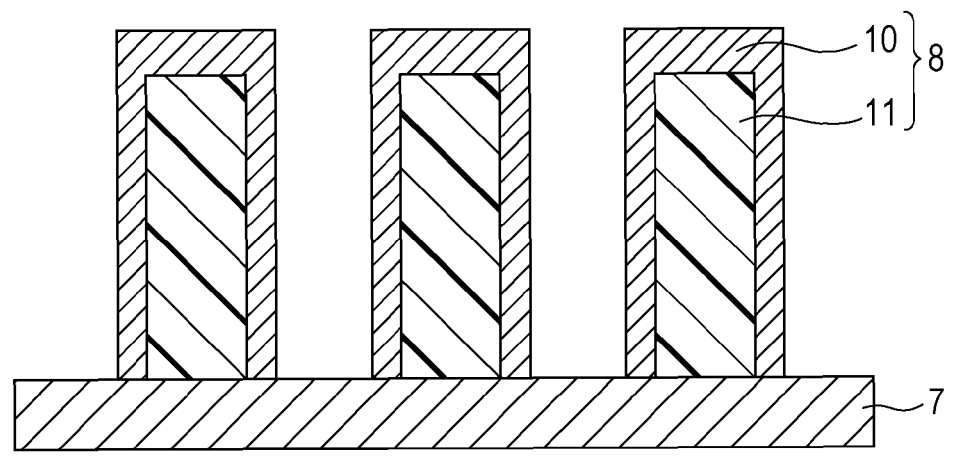

In another example, as illustrated in FIG. 12B, the elastic component 8 includes the resin structure 11 and a conductive layer 10 formed along a surface of the resin structure 11. More specifically, the conductive layer 10 is continuously formed in a projecting shape along a protruding outline or a contour shape of the resin structure 11 provided on the electrode layer 7. Thus, the elastic component 8 is held in an electrically conductible state. When the elastic component 8 is deformed upon pressing of the pressing substrate 5, the conductive layer 10 is also deformed, and a resistance value of the elastic component 8 itself is changed. In more detail, because a thickness of the conductive layer 10 is reduced and a distance from a contact portion between the conductive layer 10 and the electrode unit 4 to the electrode layer 7 is increased, the resistance value of the elastic components 8 is increased. Accordingly, change of the later-described resistance value between the electrode unit(s) 4 and the electrode layer 7 can be moderated.

Figure 2:
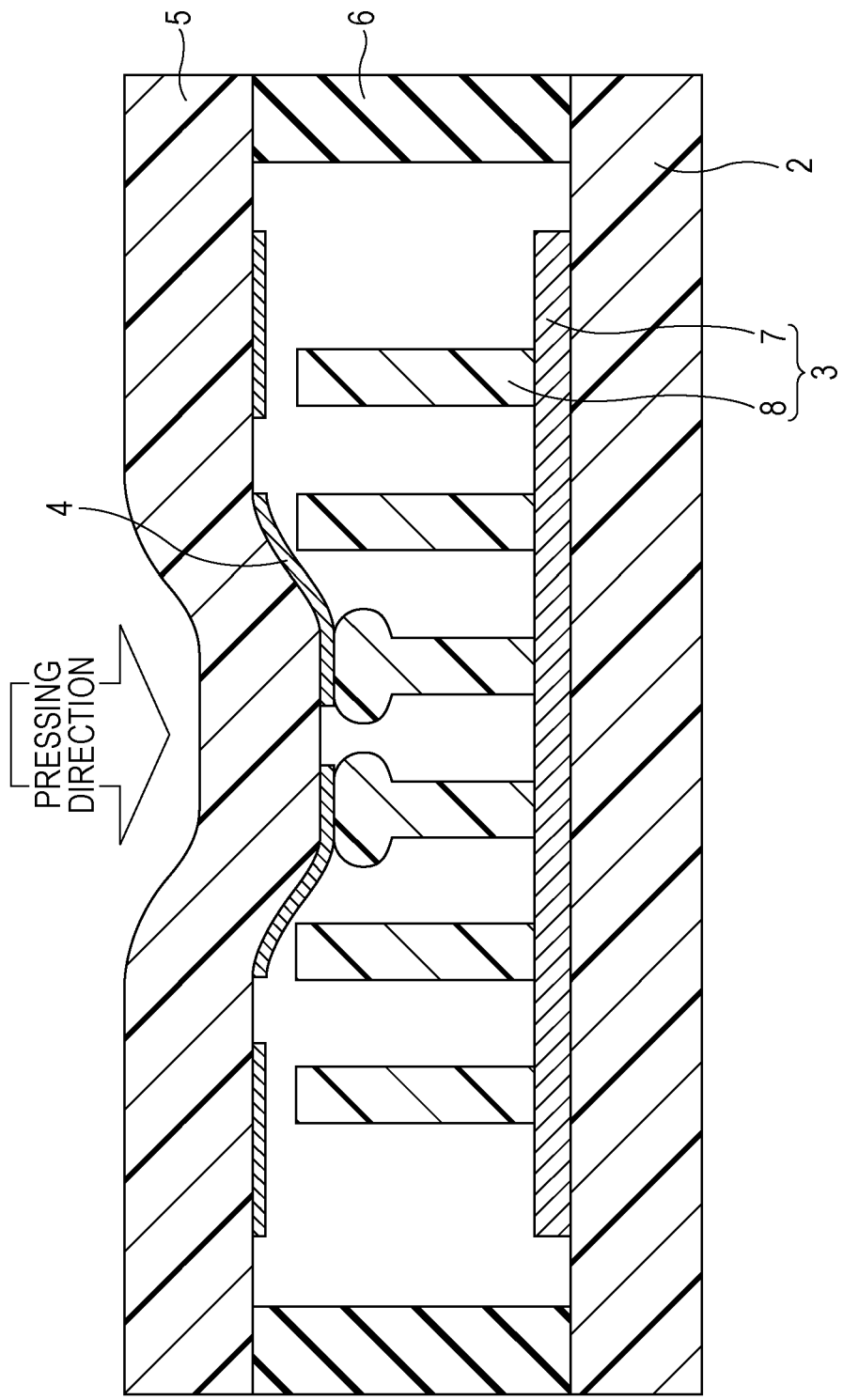
FIG. 2 is a schematic cross-sectional view illustrating a state where the pressure-sensitive switch according to the first embodiment of the present disclosure is pressed.

FIG. 2 is a schematic cross-sectional view illustrating a state where the pressure-sensitive switch according to the first embodiment of the present disclosure is pressed. As illustrated in FIG. 2, when the pressing substrate 5 is pressed toward the support substrate 2 that is disposed to face the pressing substrate 5, a pressed region of the pressing substrate 5 is distorted into a convex shape protruding toward the support substrate 2. This is because the pressing substrate 5 has flexibility similarly to the support substrate 2.

With the distortion of the pressing substrate 5, the electrode unit(s) 4 provided on a surface of the pressing substrate 5 on the side opposite to the pressed surface of the pressing substrate 5 is also distorted toward the support substrate 2. More specifically, the electrode unit(s) 4 provided on the surface of the pressing substrate 5 on the side opposite to the pressed region of the pressed surface of the pressing substrate 5 is distorted into convex shapes protruding toward the support substrate 2. The distorted electrode unit(s) 4 is contacted with the elastic component(s) 8 having conductivity and positioned to face the distorted electrode unit(s) 4, whereby electrical conduction between the electrode unit(s) 4 and the electrode layer 7 is established through the elastic component(s) 8. Thus, the pressure-sensitive switch 1 according to the present disclosure is brought into an electrically connected state. As described above, the elastic components 8 are each provided on the support substrate 2 in a state having a predetermined shape, such as a columnar or conical structure. Accordingly, good electrical connection between the electrode unit(s) 4 and the electrode layer 7 can be obtained when the pressing substrate 5 is pressed.

When a force acting to press the pressing substrate 5 toward the support substrate 2 is further increased, the shapes of those ones of the plural elastic components 8 provided on the support substrate 2, which ones correspond to the pressed region of the pressing substrate 5, can be uniformly deformed due to the elastic properties thereof. In other words, the shapes of the elastic components 8 contacting the electrode units 4 can be uniformly deformed so as to flex while their heights are reduced. With the uniform deformation of the shapes of the elastic components 8, a contact area between the electrode unit(s) 4 and the elastic component(s) 8 can be uniformly increased. The expression "the uniform deformation of the elastic components 8" in this specification implies that, when the pressing substrate 5 is pressed under the same pressing conditions, the elastic components 8 corresponding to the pressed region are deformed into the same shape and size. Such uniform deformation is resulted from the fact that, as described above, the elastic components 8 having the same shape and size are formed of, e.g., a urethane resin, a silicone based resin, or a styrene resin, and have the same elastic property.

Figure 5:
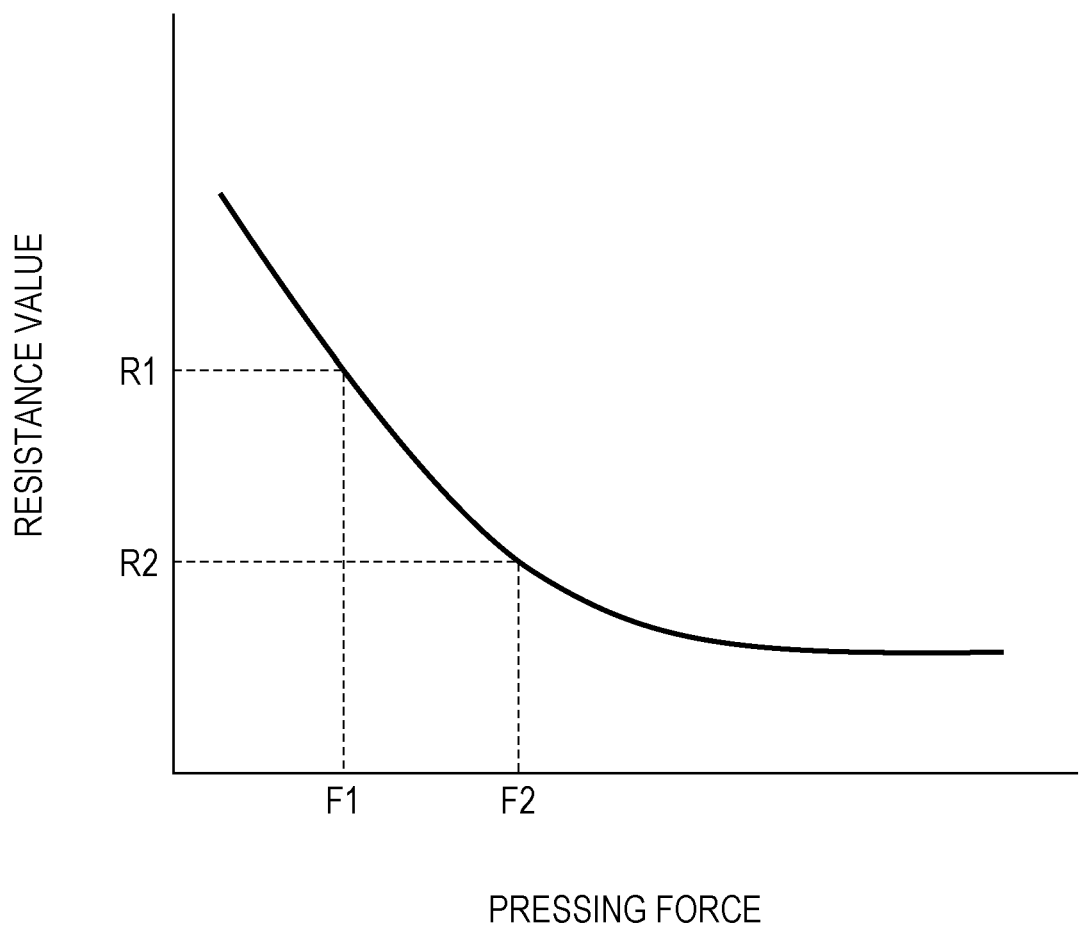
FIG. 5 is a plot of a resistance characteristic in the pressure-sensitive switch according to the first embodiment of the present disclosure.

FIG. 5 is a plot of a resistance characteristic in the pressure-sensitive switch according to the first embodiment of the present disclosure. The plot of the resistance characteristic represents change of a resistance value between the electrode unit(s) 4 and the electrode layer 7 with respect to the pressing force applied through the pressing substrate 5. As seen from FIG. 5, the resistance value between the electrode unit(s) 4 and the electrode layer 7 reduces continuously as the pressing force applied through the pressing substrate 5 increases. Such continuous reduction of the resistance value can be obtained with the above-mentioned feature that the contact area between the elastic component(s) 8 and the electrode unit(s) 4 can be uniformly increased. As described above, because each elastic component 8 has conductivity, the electrical conduction between the electrode unit(s) 4 and the electrode layer 7 can be established through the elastic component(s) 8. Therefore, the resistance value between the electrode unit(s) 4 and the electrode layer 7 through the elastic component(s) 8 can be continuously reduced with the uniform increase of the contact area between the elastic component(s) 8 and the electrode unit(s) 4. Accordingly, the pressing force applied through the pressing substrate 5 can be sensed with high accuracy. In other words, a value of the pressing force applied through the pressing substrate 5 can be calculated with high accuracy from an amount of continuous reduction of the resistance value between the electrode unit(s) 4 and the electrode layer 7.

The elastic components 8 are each provided on the electrode layer 7 such that one end of the elastic component 8 is substantially fixed to the electrode layer 7. Therefore, even when the pressing substrate 5 is pressed repeatedly, shear forces are less apt to act between the elastic component 8 and the electrode layer 7. Thus, deterioration of the elastic component 8 can be suppressed. Furthermore, since the elastic components 8 are each provided on the electrode layer 7 in a state having a predetermined shape, such as a columnar or conical structure, the pressure applied to the elastic components 8 upon pressing of the pressing substrate 5 can be made uniform. It is hence possible to suppress deterioration of the elastic components 8, and to sense the pressing force applied through the pressing substrate 5 with high accuracy in a continued way.

Figure 6:
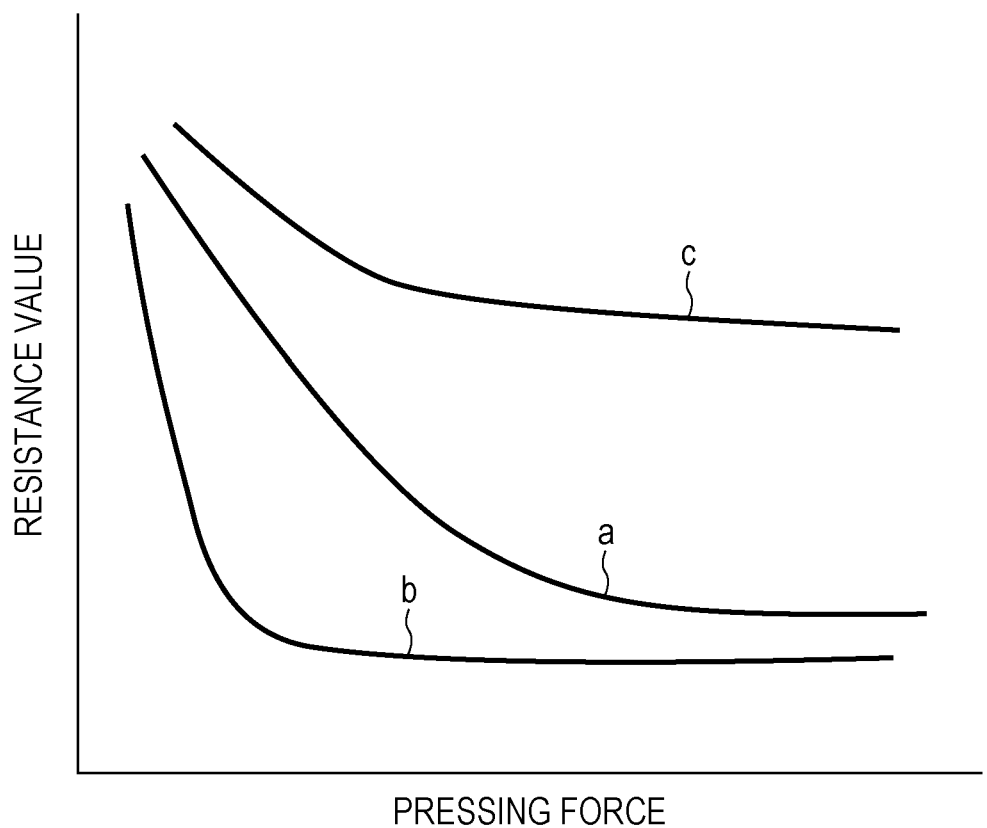
FIG. 6 is a plot of resistance characteristics in the pressure-sensitive switch according to the first embodiment of the present disclosure.

The elastic modulus of the elastic component 8 is set to, e.g., about 600 to 1500 kgf/cm$^2$ such that the elastic component 8 is gradually deformed by the pressing force in the range of about 1 N to 10 N, which is usually applied in use of the pressure-sensitive switch 1. FIG. 6 is a plot of resistance characteristics in the pressure-sensitive switch according to the first embodiment of the present disclosure when the elastic components 8 having different elastic properties are used. The plot of the resistance characteristics represents respective changes of the resistance value between the electrode unit(s) and the electrode layer 7 with respect to the pressing force applied through the pressing substrate 5 when the elastic components 8 having different elastic properties are used. A curve b represents change of the resistance value between the electrode unit(s) 4 and the electrode layer 7 with respect to the pressing force applied through the pressing substrate 5 when the elastic component 8 having the elastic modulus of less than about 600 kgf/cm$^2$ is used. A curve c represents change of the resistance value between the electrode unit(s) 4 and the electrode layer 7 with respect to the pressing force applied through the pressing substrate 5 when the elastic component 8 having the elastic modulus of more than about 1500 kgf/cm$^2$ is used. In the case of the curve b, even when the pressing force applied through the pressing substrate 5 is relatively small, the contact area between the elastic component 8 and the electrode unit 4 is abruptly increased because the elastic component 8 is easily deformed. Thus, it is difficult to sense the pressing force applied through the pressing substrate 5 with high accuracy for the reason that the resistance value is greatly changed even by a small pressing force. In the case of the curve c, even when the pressing force applied through the pressing substrate 5 is relatively large, the resistance value between the electrode unit(s) 4 and the electrode layer 7 is hardly changed because the elastic component(s) 8 is hard to deform and the contact area between the elastic component 8 and the electrode unit 4 is hardly changed. Thus, it is also difficult to sense the pressing force applied through the pressing substrate 5 with high accuracy. On the other hand, in the case of a curve a, when the pressing force is applied in the above-mentioned range, the contact area between the elastic component 8 and the electrode unit 4 is gradually increased and the resistance value is gently reduced. Thus, the pressing force applied through the pressing substrate 5 can be sensed with high accuracy. A surface resistance value of the electrode layer 7 is, for example, 50 kΩ/sq. to 5 MΩ/sq. A surface resistance value of the electrode unit 4 is, for example, 0.5 kΩ/sq. to 30 kΩ/sq. If the resistance values of the electrode layer 7 and the electrode unit 4 are too small, the resistance value between the electrode layer 7 and the electrode unit(s) 4 is excessively reduced even when the pressing force applied through the pressing substrate 5 is small. On the other hand, if the resistance values of the electrode layer 7 and the electrode unit 4 are too large, the resistance value between the electrode layer 7 and the electrode unit(s) 4 is hardly reduced even when the pressing force applied through the pressing substrate 5 is increased. Accordingly, the resistance values of the electrode layer 7 and the electrode unit 4 are preferably held in the above-described ranges. When the electrode layer 7 and the electrode unit 4 are formed by coating ink as described later in connection with a manufacturing method for the pressure-sensitive switch according to the present disclosure, their resistance values can be controlled by properly adjusting the concentration and shapes of conductive particles contained in the ink. When the electrode layer 7 and the electrode unit 4 are formed by plating, their resistance values can be controlled by adjusting the composition, concentration, temperature, etc. of a plating solution so as to change, e.g., the density of a plated film.

Figure 3:
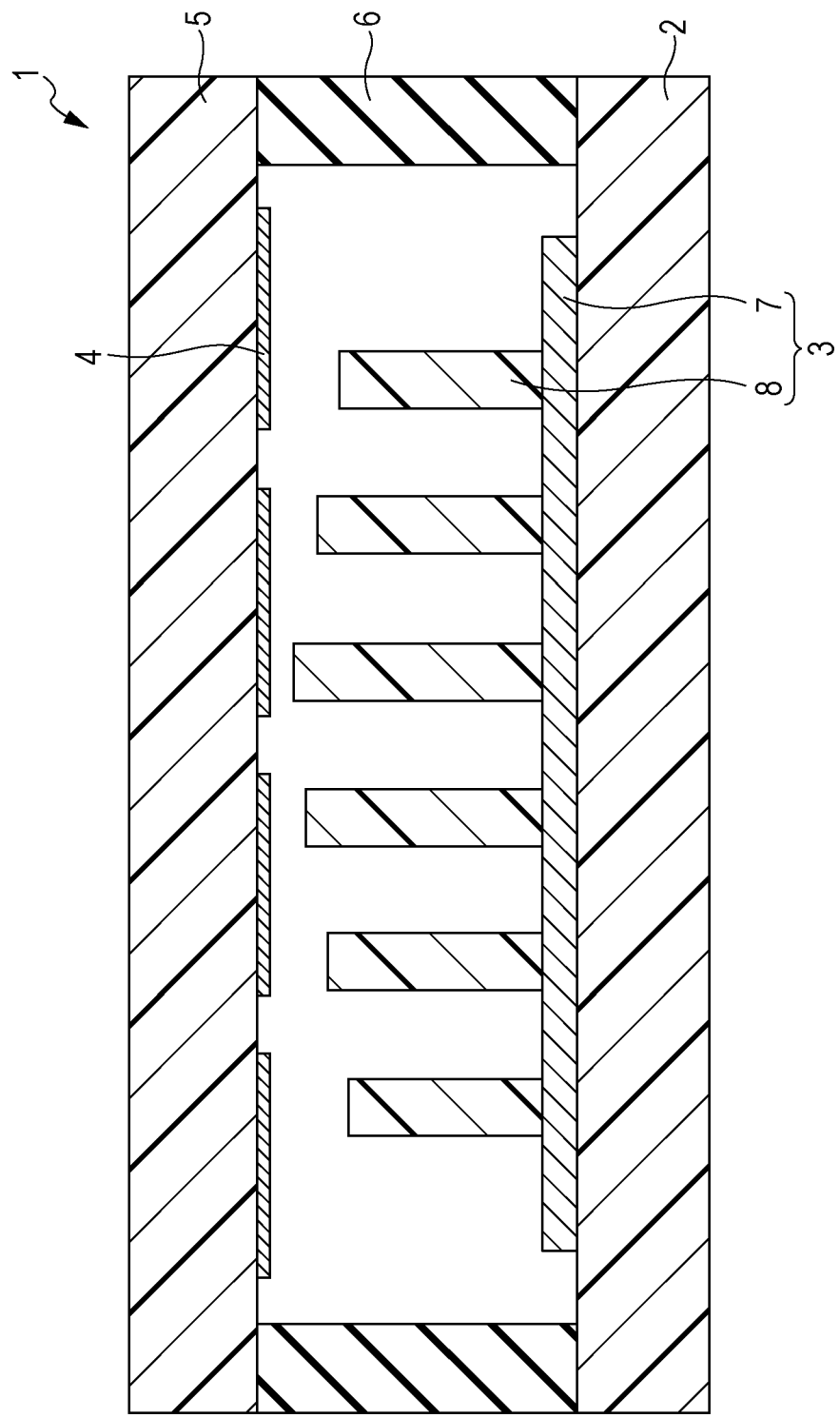
FIG. 3 is a schematic cross-sectional view illustrating a plurality of elastic components having different heights, which are structural elements of the pressure-sensitive switch according to the first embodiment of the present disclosure.
Figure 4:
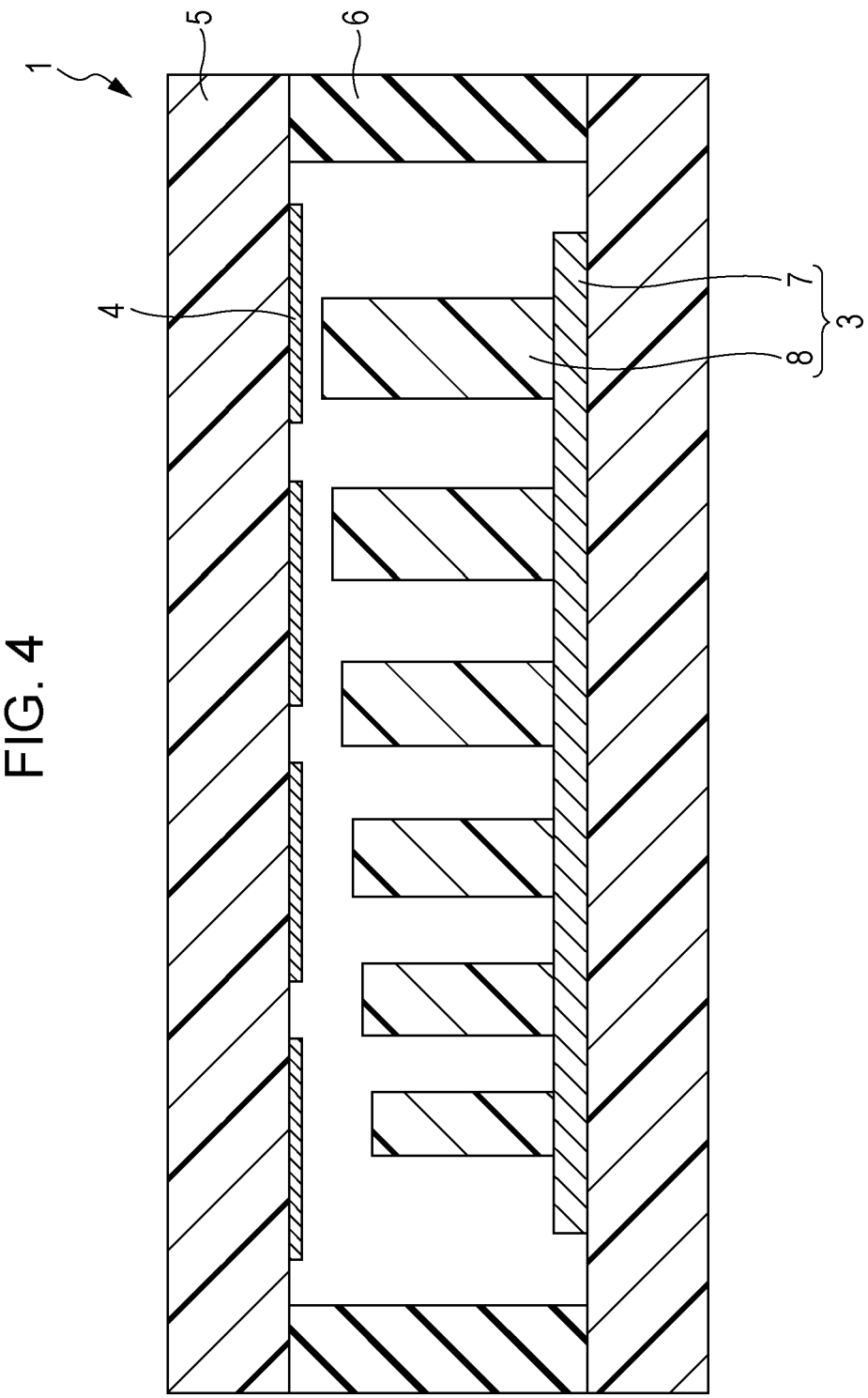
FIG. 4 is a schematic cross-sectional view illustrating an arrangement that heights of the plural elastic components, which are the structural elements of the pressure-sensitive switch according to the first embodiment of the present disclosure, correspond in relative magnitude to projection cross-sectional areas of the plural elastic components.

The individual elastic components preferably have different heights, as illustrated in FIG. 3. However, the heights of the elastic components 8 are not needed to be different from one another. It is just required that at least one of the elastic components 8 has a different height from the height of the other elastic components 8. By proper controlling the heights of the elastic components 8 in advance, change of the contact area between the electrode unit(s) 4 and the elastic component(s) 8 can be moderated. Therefore, change of the resistance value between the electrode unit(s) 4 and the electrode layer 7 can be moderated. Hence the pressing force applied through the pressing substrate 5 can be sensed with high accuracy. Stated in another way, change of the contact area between the electrode unit(s) 4 and the elastic component(s) 8 can be made more moderate. It is hence possible to sense the pressing force applied through the pressing substrate 5 with higher accuracy. Furthermore, the heights of the plural elastic components 8 preferably correspond in relative magnitude to projection cross-sectional areas of the plural elastic components 8 as illustrated in FIG. 4. In more detail, of at least two elastic components 8, the relatively high elastic component 8 preferably has a relatively large projection cross-sectional area. Of at least two elastic components 8, the relatively low elastic component 8 preferably has a relatively small projection cross-sectional area. The projection cross-sectional area of the elastic component 8 is easier to control than the height of the elastic component 8. Thus, the change of the resistance value between the electrode unit(s) 4 and the electrode layer 7 can be moderated, and the pressing force applied through the pressing substrate 5 can be sensed with higher accuracy.

The elastic components 8 are each more preferably provided in the conical structure on the electrode layer 7. When the elastic component 8 is of the conical structure, the contact area between the electrode unit 4 and the elastic component 8 is continuously changed regardless of the magnitude of the pressing force. Therefore, the resistance value between the electrode unit(s) 4 and the electrode layer 7 is continuously changed at all times during the pressing. Hence the pressing force applied through the pressing substrate 5 can be sensed with high accuracy. In addition, each elastic component 8 preferably includes a regularly rugged region in its surface. The change of the contact area between the electrode unit 4 and the elastic component 8 including the regularly rugged region, caused by the pressing through the pressing substrate 5, can be more finely controlled.

Therefore, the resistance value between the electrode unit(s) 4 and the electrode layer 7 can be more finely changed. It is hence possible to sense the pressing force applied through the pressing substrate 5 with higher accuracy.

FIGS. 7A to 7E are each a schematic plan view illustrating a shape of the electrode unit 4 that is a structural element of the pressure-sensitive switch 1 according to the first embodiment of the present disclosure. In one example, as illustrated in FIG. 7A, the electrode unit 4 may be formed over the entire surface of the pressing substrate 5. An electrical output unit 23 is provided in the electrode unit 4. However, the electrode unit 4 is not limited to that example, and it may be practiced in other forms. In another example, the plural electrode units 4 may be formed in a regular array (FIG. 7B). In such a case, the electrical output unit 23 is provided for each of the electrode units 4. With that example, when the contact area between the electrode unit 4 and the elastic component 8 is changed upon pressing, a pressed position in the plane direction can also be concurrently detected in addition to the pressing force by reading changes of resistance values between the individual electrode units 4 and the electrode layer 7. Moreover, the pressed position in the plane direction can also be detected in addition to the pressing force by reading changes of resistance values among the individual electrode units 4 instead of the changes of the resistance values between the individual electrode units 4 and the electrode layer 7.

When reading the changes of the resistance values between the individual electrode units 4, a local contact failure between the electrode unit 4 and the Plastic component 8 can be compensated for by forming an electrode pattern, which includes a contact placed at the circumference and a contact placed at the center, as illustrated in FIGS. 7C to 7E. Thus, the changes of the resistance values can be stably read. In FIG. 7C, the contact placed at the center has a substantially circular shape, and the contact placed at the circumference is formed in a substantially ring-like or U-like shape around the contact placed at the center. In FIG. 7D, two substantially semicircular contacts placed at the center are disposed inside the contact placed at the circumference. Such an arrangement can output two resistance values between the contact placed at the circumference and one contact placed at the center and between the contact placed at the circumference and the other contact placed at the center. Furthermore, as illustrated in FIG. 7E, two contacts placed at the center may be disposed in forms of combs meshing with each other inside two substantially arc-shaped contacts placed at the circumference. With such an arrangement, stable change of the resistance value can be obtained even when the pressing substrate 5 and the support substrate 2 are slightly deviated from each other. Also in the examples illustrated in FIGS. 7C to 7E, the electrical output unit 23 is provided in each of the electrode units 4.

(Second Embodiment According to Present Disclosure)

The pressure-sensitive switch 1 according to the present disclosure can be practiced as not only the first embodiment described above, but also as a second embodiment described below. A pressure-sensitive switch 1 according to the second embodiment of the present disclosure will be described below with reference to FIGS. 8C and 8D.

Figure 8C:
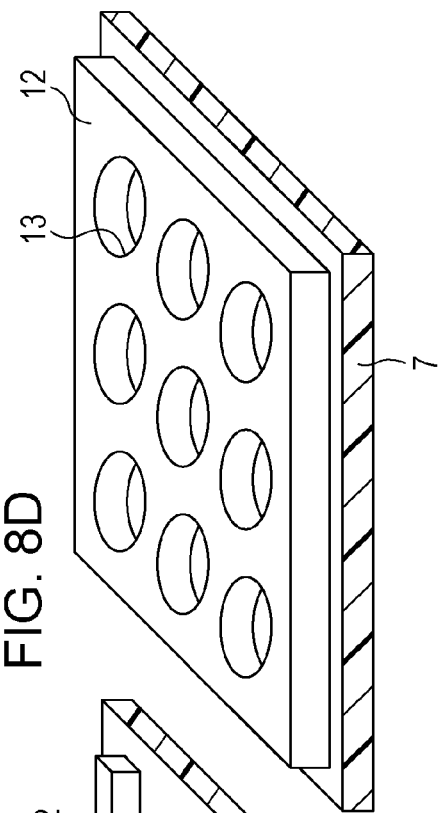
Figure 8D:
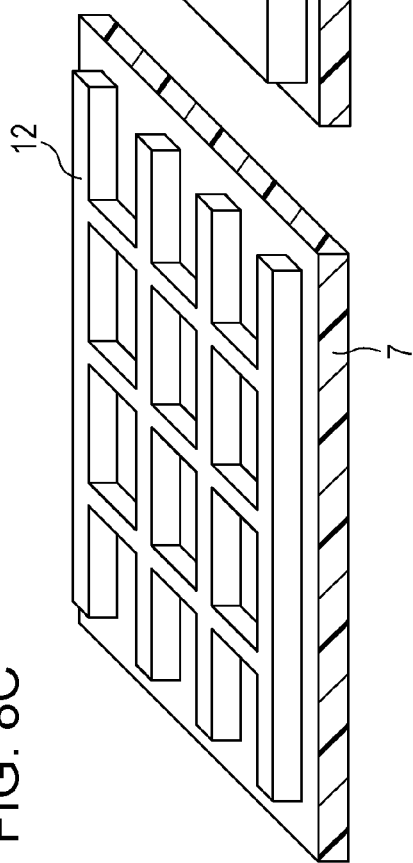

The pressure-sensitive switch 1 according to the second embodiment of the present disclosure includes a support substrate 2, a conductive structure 3 provided on the support substrate 2, and a pressing substrate 5 disposed above the conductive structure 3. The conductive structure 3 includes an electrode layer 7 disposed on the support substrate 2, and an elastic component 12 protruding in an entirely continuous form from the electrode layer 7. The elastic component 12 protruding in an entirely continuous form from the electrode layer 7 may have a structure that the elastic component 12 is formed in a grid-like manner on the electrode layer 7 as illustrated in FIG. 8C, or that the elastic component 12 including holes 13 is formed on the electrode layer 7 as illustrated in FIG. 8D. However, the elastic component 12 is not limited to the above-mentioned structures because the elastic component 12 in this embodiment is just required to protrude in an entirely continuous form from the electrode layer 7. In a broad sense, the elastic component 12 including the holes 13 formed as illustrated in FIG. 8D can also be regarded as an example in which the elastic component 12 is provided in a grid-like manner on the electrode layer 7.

The elastic component 12 has "conductivity". In one example, the elastic component 12 includes a resin structure and conductive fillers uniformly present in the resin structure. The resin structure is made of, e.g., a urethane resin, a silicone based resin such as polydimethylpolysiloxane (PDMS), or a styrene resin, each having an elastic property. The conductive fillers are made of a material selected from a group including Au, Ag, Cu, C, ZnO, $In_2O_3$, $SnO_2$, etc. As described later, when the pressing substrate 5 is pressed, the shape of a portion of the elastic component 12 corresponding to a pressed region of the pressing substrate 5 is uniformly deformed due to the elastic property thereof. At that time, when the elastic component 12 corresponding to the pressed region is deformed and its height is reduced, the conductive fillers present inside the elastic component 12 are contacted with each ocher. Thus, the elastic component 12 is brought into an electrically conductible state. With the mutual contact of the conductive fillers present inside the elastic component 12, a contact area between the conductive fillers is changed. Accordingly, conductivity of the elastic component 12 also changes, whereby sharper change can be obtained in a later-described resistance value between the electrode unit(s) 4 and the electrode layer 7.

In another example, the elastic component 12 includes the resin structure and a conductive layer formed along a surface of the resin structure. More specifically, the conductive layer is continuously formed in a projecting shape along a protruding outline or a contour shape of the resin structure provided on the electrode layer 7. Thus, the elastic component 12 is held in an electrically conductible state.

When the elastic component 12 is deformed, the conductive layer is also deformed, and a resistance value of the elastic component 12 itself is changed. In more detail, because a thickness of the conductive layer is reduced and a distance from a contact portion between the conductive layer and the electrode unit 4 to the electrode layer 7 is increased, the resistance value of the elastic component 12 is increased. Accordingly, change of the later-described resistance value between the electrode unit(s) 4 and the electrode layer 7 can be moderated.

When the pressing substrate 5 is pressed toward the support substrate 2 that is disposed to face the pressing substrate 5, a pressed region of the pressing substrate 5 is distorted into a convex shape protruding toward the support substrate 2. With the distortion of the pressing substrate 5, the electrode unit provided on a surface of the pressing substrate 5 on the side opposite to the pressed surface of the pressing substrate 5 is also distorted toward the support substrate 2 The distorted electrode unit is contacted with the elastic component 12 having conductivity, whereupon a current flows between the electrode unit 4 and the electrode layer 7 through the elastic component 12 having conductivity. Thus, the pressure-sensitive switch 1 according to this embodiment of the present disclosure is brought into an electrically connected state.

When a force acting to press the pressing substrate 5 toward the support substrate 2 is further increased, the shape of the portion of the continuously-formed elastic component 12 corresponding to the pressed region of the pressing substrate 5 can be uniformly deformed due to the elastic property thereof. In other words, the portion of the elastic component 12, the portion corresponding to the pressed region and contacting the electrode unit, can be uniformly deformed so as to flex while its height is reduced. With the uniform deformation of the elastic component 12, a contact area between the electrode unit and the elastic component 12 can be uniformly increased. The height of a portion of the elastic component 12 may be different from that of the other portion, though not being particularly limited to such a case.

The electrode unit is provided to face the elastic component 12 that is continuously formed over the entire electrode layer 7. With such an arrangement, even when the pressing substrate 5 is pressed repeatedly, pressure applied to a portion of the continuously-formed elastic component 12, the portion corresponding to the pressed region, can be distributed to the entire elastic component 12. Accordingly, deterioration of the elastic component 12 can be suppressed. It is hence possible to sense the pressing force applied through the pressing substrate 5 with high accuracy in a continued way.

Because the elastic component 12 is provided in a continuous form entirely protruding from the electrode layer 7 the electrode unit disposed to face the elastic component 12 is preferably formed over the entire surface of the pressing substrate 5. However, the electrode unit is not limited to such a configuration, and it may be provided plural. In that case, individual electrode units may he disposed to face the elastic component 12. This enables the pressing force and the pressed position to be detected from changes of resistance values between the electrode layer 7 and the individual electrode units through the elastic component 12. The pressing force and the pressed position can also be detected from changes of resistance values between the individual electrode units.

In any of the above-described embodiments, the structural elements of the pressure-sensitive switch 1 according to the present disclosure, i.e., the support substrate 2, the elastic components 8 and 12, the electrode layer 7, the electrode unit 4, the conductive layer 10, and the conductive filler 9, are preferably transparent in the visible region. To ensure the transparency, the structural elements of the pressure-sensitive switch 1 according to the present disclosure preferably have the following features. The support substrate 2 is preferably made of, e.g., polyethylene terephthalate or polycarbonate. The elastic components 8 and 12 are each preferably made of a urethane resin, a silicone based resin, a styrene resin, or an acrylic resin such as polymethacrylic acid methyl, each having a high transparency and being soft. The electrode layer 7, the electrode unit 4, and the conductive layer 10 are each preferably made of a transparent semiconductor material, such as $In_2O_3$, ZnO or $SnO_2$. Alternatively, the electrode layer 7 may be formed by coating particles, which are made of, e.g., Au, Ag, Cu or C and have nano wire shapes with diameters of several tens nm, over the support substrate 2. The electrode unit 4 may be formed by coating particles, which are made of, e.g., Au, Ag, Cu or C and have nano wire shapes with diameters of several tens nm, over the pressing substrate 5. The conductive layer 10 may be formed by coating particles, which are made of, e.g., Au, Ag, Cu or C and have nano wire shapes with diameters of several tens nm, over the elastic component 8 or 12. As another example, the electrode layer 7, the electrode unit 4, and the conductive layer 10 may be each formed as a pattern of meshes in size of about several µm to several tens µm, which are made of, e.g., Ag or Cu and which are defined by lines having widths of several hundreds nm to several hundreds µm. Since the pressure-sensitive switch 1 according to the present disclosure is transparent in the visible region, visibility of a device, e.g., a touch panel, including the pressure-sensitive switch 1 according to the present disclosure, can be further improved when a user looks at the device. In other words, user-side convenience of the device can be further improved.

Figure 10:
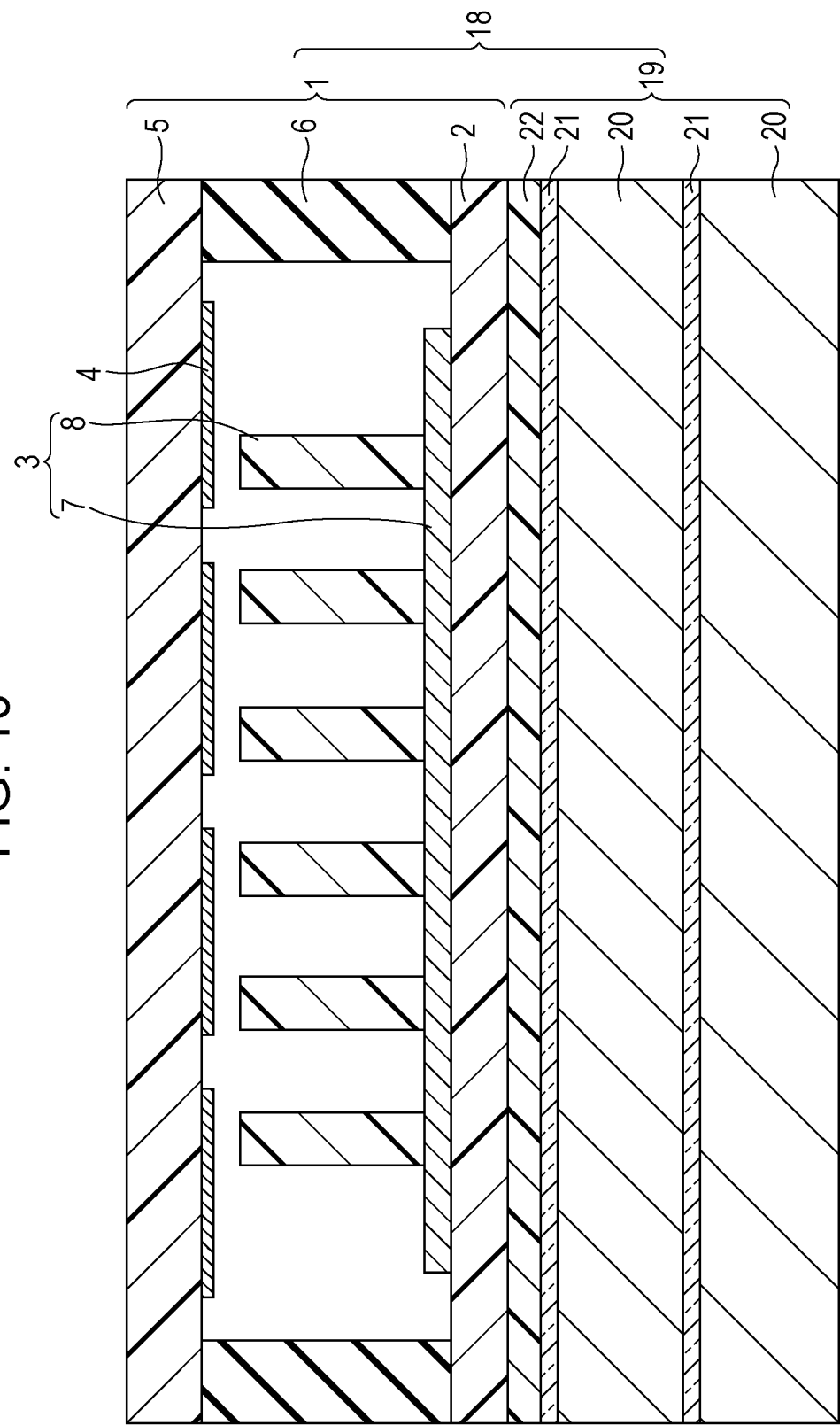
FIG. 10 is a schematic cross-sectional view of a touch panel including the pressure-sensitive switch according to the present disclosure.

FIG. 10 is a schematic cross-sectional view of a touch panel 18 including the pressure-sensitive switch 1 according to the present disclosure. As illustrated in FIG. 10, the touch panel 18 including the pressure-sensitive switch 1 according to the present disclosure is constituted by a sensor 19 that detects only a touch location in the plane direction, and the pressure-sensitive switch 1 according to the present disclosure, which is disposed on the sensor 19 with a cover film 22 interposed between them. The sensor 19 is a composite structure in which two structures, each including a substrate 20 and a transparent conductive film 21 disposed on the substrate 20, are stacked one above the other in the pressing direction. The touch location in the plane direction is detected by the electrostatic capacitive method, for example. Thus, the touch panel 18 according to the present disclosure can detect the touch location in the plane direction and the pressing force.

((Manufacturing Method for Pressure-Sensitive Switch According to Present Disclosure))

A manufacturing method for the pressure-sensitive switch according to the first embodiment of the present disclosure will be described below. FIGS. 9A to 9E referred to here to explain the manufacturing method schematically illustrate successive steps of the manufacturing method for the pressure-sensitive switch according to the first embodiment of the present disclosure. Though not illustrated, a later-described manufacturing method for the pressure-sensitive switch according to the second embodiment of the present disclosure is basically similar to that for the pressure-sensitive switch according to the first embodiment of the present disclosure.

(Step of Preparing Support Substrate 2)

First, the support substrate 2 is prepared as illustrated in FIG. 9A. The support substrate 2 has flexibility and is made of plastic, such as polyethylene terephthalate, polycarbonate, or polyimide.

(Step of Forming Electrode Layer 7)

Next, as illustrated in FIG. 9B, ink containing conductive particles dispersed therein is continuously coated over the support substrate 2 without blanks. In practice, the ink containing conductive particles dispersed therein implies ink in which conductive particles made of a material selected from a group including Au, Ag, Cu, C, ZnO, $In_2O_3$, $SnO_2$, etc. are dispersed. When coating the ink containing the conductive particles dispersed therein, a paste prepared by mixing and dispersing a binder resin into an organic solvent is preferably coated by printing. The binder resin functions as a binder to bind the conductive particles to one another, thus increasing durability of the electrode layer 7. By properly adjusting the viscosity of the coated ink, the electrode layer 7 can be uniformly formed on the support substrate 2 The binder resin may be, for example, an ethylcellulose resin or an acrylic resin. The organic solvent may be, for example, terpineol or butyl carbitol acetate.

It is also preferable to form the electrode layer 7 by electroless plating. The term "electroless plating" implies a technique of forming a metal thin film, i.e., the electrode layer 7, with electrons supplied through an oxidation reaction of a reducing agent, which is added to an aqueous solution, without employing an external DC power supply. In the electroless plating, no current flows through a bath unlike electroplating. Therefore, plating can be performed in a state where a catalyst promoting the oxidation reaction of the reducing agent is applied to not only a conductive material, but also to a nonconductive material, such as the plastic constituting the support substrate 2. For example, Pd is used as the catalysis, though not being particularly limited to Pd. By immersing the support substrate 2, including the catalyst, into a plating solution that contains a desired metal element, metal film is formed on the catalyst and the electrode layer 7 is obtained. The electrode layer 7 having the desired durability can be formed by adjusting the composition ratio, concentration, temperature, etc. of the plating solution. By forming the electrode layer 7 as described above, even when the pressing substrate 5 is pressed repeatedly, shear forces are less apt to act between each elastic component 8 and the electrode layer 7. Thus, deterioration of the elastic component 8 can be suppressed. Methods for forming the electrode layer 7 are not limited to the above-described methods of employing the ink containing the conductive particles dispersed therein, and of utilizing the electroless plating. Instead of those methods, the sol-gel method may be used to form the electrode layer 7. The term "sol-gel method" implies a liquid-phase synthesis method of obtaining a polymer solid by utilizing a hydrolytic polycondensation reaction of a metal alkoxide compound or metal salt. Alternatively, the electrode layer 7 may be formed by sputtering or vapor deposition.

(Step of Forming Elastic Components 8)

Figure 9C:
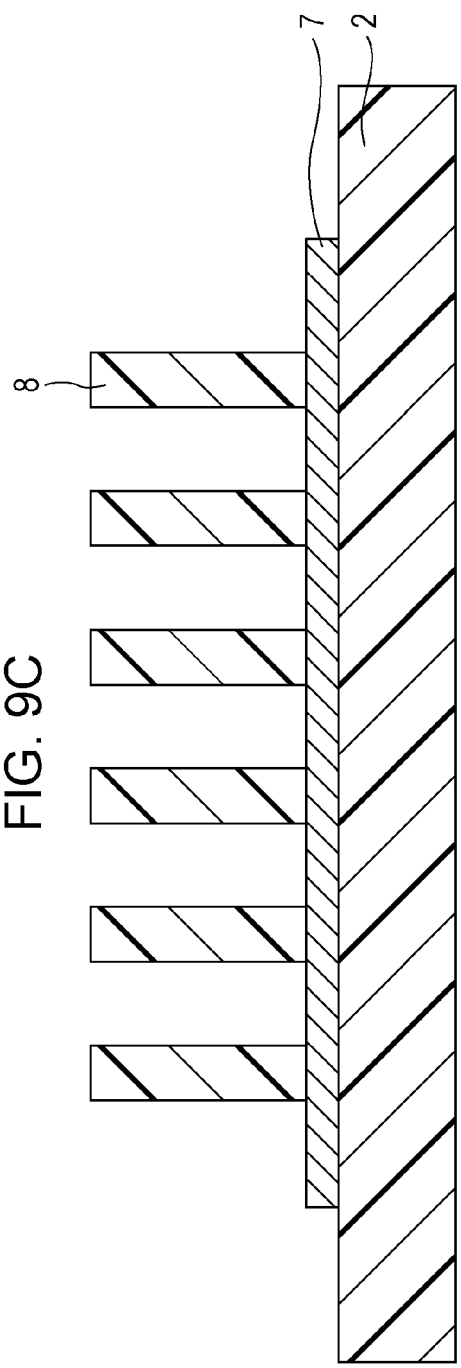

Next, a composite material prepared by mixing conductive fillers into a liquid polymer resin material made of, e.g., a urethane resin, a silicone based resin, or a styrene resin is coated over the electrode layer 7. The conductive fillers are made of a material selected from a group including Au, Ag, Cu, C, ZnO, $In_2O_3$, $SnO_2$, etc. Then, the composite material coated over the electrode layer 7 is pressed by a mold having a rugged pattern and is hardened. Thus, as illustrated in FIG. 9C, the rugged pattern of the mold is transferred to the coated composite material, and the elastic components 8 each having a locally pillar shape (e.g., a columnar or conical structure) and containing the conductive fillers can he formed on the electrode layer 7. The above-mentioned method of forming the elastic components 8 employs the nano imprint technique. The term "nano imprint technique" implies a technique of pressing a mold having a rugged pattern against a resin used as a material to be transferred, and transferring the rugged pattern formed in the mold in nano order to the resin. The nano imprint technique can form solids having slopes, such as cones, in a fine pattern at a lower cost than that required in the known lithography technique. In the case using the nano imprint technique, shapes and heights of the elastic components 8 can be easily controlled by employing a mold that has a desired rugged pattern, determined in advance. Projection cross-sectional shapes of the elastic components 8 can also be easily controlled by employing the nano imprint technique. Therefore, the change of the contact area between the electrode unit(s) 4 and the elastic component(s) 8 can be made more moderate. Thus, the change of the resistance value between the electrode unit(s) 4 and the electrode layer 7 can be moderated with the interposition of the elastic components 8. It is hence possible to sense the pressing force applied through the pressing substrate 5 with high accuracy. As a matter of course, the elastic components 8 may be formed by photolitho-etching or the development and separation technique instead of the nano imprint technique. Also in the case using the photolitho-etching, the elastic components 8 having the desired shapes, heights, projection cross-sectional shapes, etc. can be formed on the support substrate 2 by controlling the concentration and the flow rate of an etching liquid.

In another example, a liquid polymer resin material made of, e.g., a urethane resin, a silicone based resin, or a styrene resin is coated over the electrode layer 7. Then, the polymer resin material coated over the electrode layer 7 is pressed by a mold having a rugged pattern and is hardened. As a result, the rugged pattern of the mold is transferred to the coated polymer resin material, and the resin structures 11 each having a locally pillar shape (e.g., a columnar or conical structure) is formed on the electrode layer 7. The above-mentioned method of forming the resin structure 11 employs the nano imprint technique. The resin structure 11 may be formed by photolitho-etching or the development and separation technique instead of the nano imprint technique. Then, the ink containing conductive particles dispersed therein is continuously coated along a protruding outline or a contour shape of each resin structure 11 without blanks, thereby forming the conductive layer 10 along the protruding outline or the contour shape of each resin structure 11. The conductive layer 10 may be formed by electroless plating or the sol-gel method instead of the above-mentioned method. As a result, the elastic components 8 having conductivity can be formed on the electrode layer 7, each elastic component 8 including the resin structure 11 and the conductive layer 10 that is formed in the projecting shape along the protruding outline of the resin structure 11.

As described above, the conductive structure 3 can be formed as an integral structure of the plural elastic components 8 having conductivity and the electrode layer 7.

(Step of Forming Spacer 6)

Figure 9D:
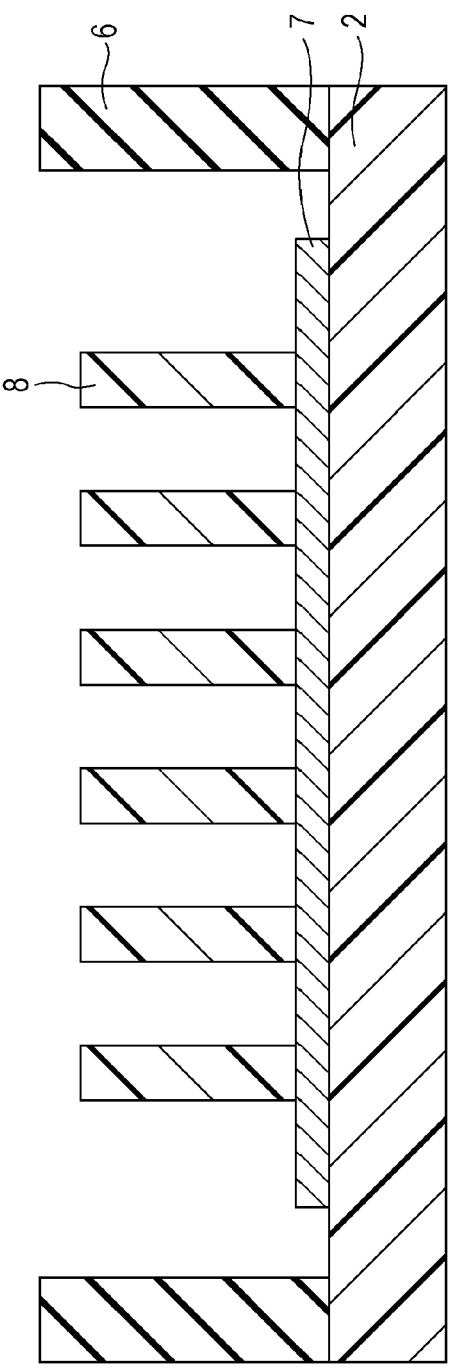

Next, as illustrated in FIG. 9D, the spacer 6 is formed on a peripheral edge of the support substrate 2 by employing insulating resin, such as a polyester resin or an epoxy resin.

(Step of Disposing Pressing Substrate 5)

Next, the plural electrode units 4 are provided in spaced relation from each other at intervals on the pressing substrate 5 that is made of, e.g., plastic having flexibility. Examples of the plastic include polyethylene terephthalate, polycarbonate, and polyimide. The pressing substrate 5 including the plural electrode units 4 is then disposed on the spacer 6 such that the electrode units 4 are positioned to face the elastic components 8. The electrode units 4 are also preferably formed by coating, over the pressing substrate 5, the ink containing conductive particles dispersed therein. In another example, the electrode units 4 are preferably formed by electroless plating. As an alternative, the electrode units 4 may be formed by the sol-gel method.

Figure 9E:
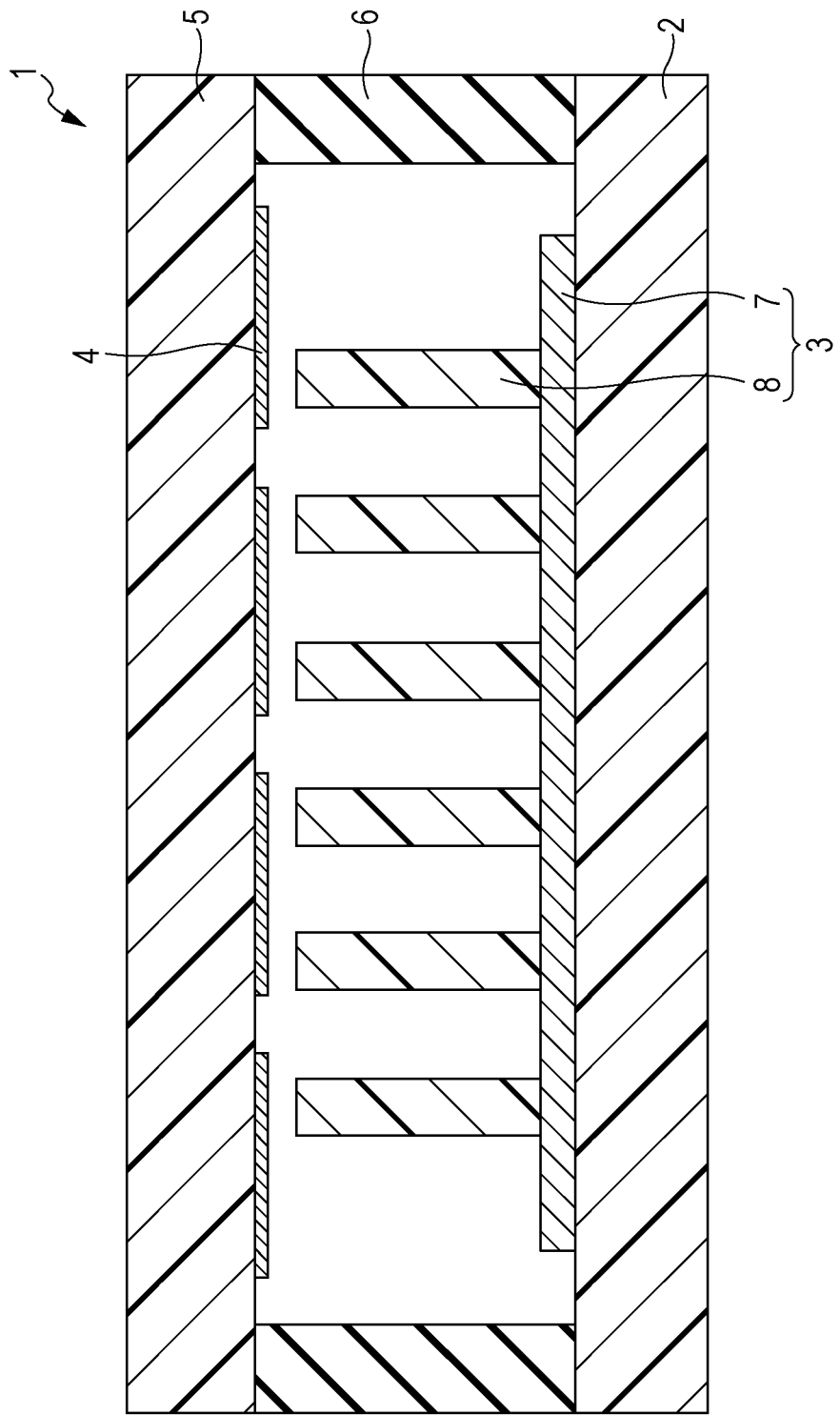

Through the above-described steps, as illustrated in FIG. 9E, the pressure-sensitive switch according to the first embodiment of the present disclosure can be manufactured.

A manufacturing method for the pressure-sensitive switch according to the second embodiment of the present disclosure will be described below. Similar points to those in the manufacturing method for the pressure-sensitive switch according to the first embodiment of the present disclosure are described in a simplified fashion.

(Step of Preparing Support Substrate 2)

First, the support substrate 2 is prepared. The support substrate 2 has flexibility and is made of plastic, such as polyethylene terephthalate, polycarbonate, or polyimide.

(Step of Forming Electrode Layer 7)

Next, the electrode layer 7 is formed by continuously coating ink containing conductive particles dispersed therein over the support substrate 2 without blanks. It is also preferable to form the electrode layer 7 by electroless plating. Methods for forming the electrode layer 7 are not limited to the above-described methods, and the electrode layer 7 may be formed by, e.g., the sol-gel method, sputtering, or vapor deposition.

(Step of Forming Elastic Component 12)

Next, a composite material prepared by mixing conductive fillers into a liquid polymer resin material made of e.g., a urethane resin, a silicone based resin, or a styrene resin is coated over the electrode layer 7. The composite material coated over the electrode layer 7 is then pressed by a mold having a rugged pattern and is hardened. As a result, the rugged pattern of the mold is transferred to the coated composite material, and the elastic component 12 having a continuous form as a whole and containing the conductive fillers is formed on the electrode layer 7. Thus, the elastic component 12 can be formed to protrude in the continuous form from the electrode layer 7. Alternatively, the elastic component 12 may be formed by photolitho-etching or the development and separation technique.

In another example, a liquid polymer resin material made of, e.g., a urethane resin, a silicone based resin, or a styrene resin is coated over the electrode layer 7. Then, the polymer resin material coated over the electrode layer 7 is pressed by a mold having a rugged pattern and is hardened. As a result, the rugged pattern of the mold is transferred to the coated polymer resin material, and a resin structure having a continuous form as a whole is formed on the electrode layer 7. Thus, the resin structure can be formed in a state extending to protrude in the continuous form from the electrode layer 7. Alternatively, the resin structure may be formed by photolitho-etching or the development and separation technique instead. Then, the ink containing conductive particles dispersed therein is continuously coated along a protruding outline or a contour shape of the resin structure without blanks, thereby forming a conductive layer along the protruding outline or the contour shape of the resin structure. The conductive layer may be formed by electroless plating or the sol-gel method instead of the above-mentioned method. As a result, the elastic component 12 having conductivity can be formed on the electrode layer 7, the elastic component 12 including the resin structure 11 and the conductive layer 10 that is formed in the projecting shape along the protruding outline of the resin structure 11.

(Step of Forming Spacer 6)

Next, the spacer 6 is formed on a peripheral edge of the support substrate 2.

(Step of Disposing Pressing Substrate 5)

Next, the electrode unit(s) is provided on the pressing substrate 5 that is made of, e.g., plastic having flexibility. The pressing substrate 5 including the electrode unit is then disposed on the spacer 6 such that the electrode unit is positioned to face the elastic component 12. The electrode unit is also preferably formed by coating, over the pressing substrate 5, the ink containing conductive particles dispersed therein. Alternatively, the electrode unit may be formed by electroless plating or the sol-gel method.

Through the above-described steps, the pressure-sensitive switch according to the second embodiment of the present disclosure can be manufactured.

((Manufacturing Method for Touch Panel Including Pressure-Sensitive Switch According to Present Disclosure))

A manufacturing method for the touch panel 18 including the pressure-sensitive switch 1 according to the present disclosure will be described below.

(Step of Forming Sensor 19 Detecting only Touch Location in Plane Direction)

First, the above-described structure including the substrate 20 and the transparent conductive film 21 disposed on the substrate 20 is formed. Then, a composite structure is formed by stacking two those structures successively one above the other in the pressing direction. As a result, the sensor 19 for detecting only the touch location in the plane direction can be formed. The touch location in the plane direction is detected by the electrostatic capacitive method, for example.

(Step of Disposing Cover Film 22)

Next, the cover film 22 is disposed on the sensor 19 that detects only the touch location in the plane direction.

(Step of Disposing Pressure-Sensitive Switch According to Present Disclosure)

Next, the pressure-sensitive switch according to the present disclosure, which has been obtained with the manufacturing method for the pressure-sensitive switch according to the present disclosure, is disposed on the cover film 22.

Through the above-described steps, the touch panel 18 including the pressure-sensitive switch 1 according to the present disclosure can be manufactured which includes the sensor 19 for detecting only the touch location in the plane direction, and the pressure-sensitive switch 1 disposed on the sensor 19 with the cover film 22 interposed between them.

While the pressure-sensitive switch 1 according to the present disclosure, the manufacturing method for the pressure-sensitive switch 1, the touch panel including the pressure sensitive switch 1, and the manufacturing method for the touch panel have been described above, the present disclosure is not limited to the matters disclosed in the foregoing description, it is to be understood that various modifications can be made by those skilled in the art without departing from the scope of an invention specified in the attached Claims.

The present disclosure can be embodied as follows.

According to one aspect of the present disclosure, there is provided a pressure-sensitive switch including a support substrate, a conductive structure provided on the support substrate, and a pressing substrate, and an electrode unit disposed to face the support substrate with the conductive structure interposed therebetween, wherein the conductive structure includes an electrode layer on the support substrate, and one or more elastic components having conductivity and extending to protrude from the electrode layer toward the electrode unit.

With the above-described one aspect, since the elastic component having a regular shape extends to protrude from the electrode layer, the shape of the elastic component can be uniformly deformed when a pressing substrate is pressed. Therefore, when a pressing force applied through the pressing substrate is increased, a contact area between the elastic component and the electrode unit can be uniformly increased, and variations in change of a resistance value between the electrode unit and the electrode layer can be reduced with interposition of the elastic component. As a result, the applied pressure can be sensed with nigh accuracy.

Furthermore, with the above-described one aspect, since the elastic component extends to protrude from the electrode layer, deterioration of the elastic component can be suppressed even when the pressing substrate is pressed repeatedly. As a result, reduction in sensitivity of the pressure-sensitive switch can be suppressed.

In the pressure-sensitive switch according to the one aspect, for example, each of the elastic components may include a resin, structure and conductive fillers present inside the resin structure.

In the pressure-sensitive switch according to the one aspect, for example, each of the elastic components may include a resin structure and a conductive layer formed along a surface of the resin structure.

In the pressure-sensitive switch according to the one aspect, for example, each of the elastic components may extend to protrude from the electrode layer substantially perpendicularly toward the electrode unit.

In the pressure-sensitive switch according to the one aspect, for example, each of the elastic components may have a columnar or conical shape.

In the pressure-sensitive switch according to the one aspect, for example, the conductive structure includes at least two elastic components, and the at least two elastic components may be spaced from each other.

In the pressure-sensitive switch according to the one aspect, for example, the at least two elastic components may have different heights.

In the pressure-sensitive switch according to the one aspect, for example, of the at least two elastic components, the higher elastic component may have a relatively larger projection cross-sectional area.

In the pressure-sensitive switch according to the one aspect, for example, the elastic component may extend in a continuous form from the electrode layer.

In the pressure-sensitive switch according to the one aspect, for example, the elastic component may he provided in a grid-like manner on the electrode layer.

In the pressure-sensitive switch according to the one aspect, for example, the support substrate may have flexibility.

In the pressure-sensitive switch according to the one aspect, for example, the support substrate, the electrode layer, the elastic component, the electrode unit, and the pressing substrate may be transparent to light in a visible region.

According to another aspect of the present disclosure, there is provided a touch panel including a sensor that detects a touch location, and the pressure-sensitive switch according to the one aspect, the pressure-sensitive switch being disposed on the sensor.

According to still another aspect of the present disclosure, there is provided a manufacturing method for a pressure-sensitive switch, the manufacturing method including the steps of providing a conductive structure by forming an electrode layer on a support substrate, and by forming one or more elastic components each that have conductivity and that protrude from the electrode layer, and providing an electrode unit that is positioned to face the elastic component.

With the manufacturing method for the pressure-sensitive switch according to the still other aspect of the present disclosure, the elastic component having conductivity and protruding from the electrode layer can be formed.

In the manufacturing method for the pressure-sensitive switch according to the still other aspect of the present disclosure, for example, the conductive structure may include at least two elastic components having different heights in the step of providing the conductive structure.

In the manufacturing method for the pressure-sensitive switch according to the still other aspect of the present disclosure, for example, of the at least two elastic components, the higher elastic component may have a relatively larger projection cross-sectional area.

According to a still another aspect of the present disclosure, there is provided a manufacturing method for a touch panel, the manufacturing method including the steps of forming a sensor that detects a touch location, and providing, on the sensor, the pressure-sensitive switch that is obtained by the above-described manufacturing method.

The pressure-sensitive switch 1 according to the present disclosure has the advantageous effects that the applied pressure can be sensed with high accuracy, and that deterioration of the elastic component 8 or 12 can he suppressed even when the pressing substrate 5 is pressed repeatedly. Therefore, the pressure-sensitive switch 1 according to the present disclosure can be effectively applied to touch panels in, e.g., smartphones and car navigators. Thus, users can employ the touch panels with higher convenience than in the past.

What is claimed is:

1. A pressure-sensitive switch comprising:
   a first substrate;
   a conductive structure provided on the first substrate;
   a second substrate; and
   an electrode unit disposed to face the first substrate with the conductive structure located therebetween,
   wherein the conductive structure includes an electrode layer on the first substrate, and at least two elastic components having conductivity and extending to protrude from the electrode layer toward the electrode unit, and
   the at least two elastic components are spaced from each other and have different heights.

2. The pressure-sensitive switch according to claim 1, wherein each of the at least two elastic components includes a resin structure and conductive fillers present inside the resin structure.

3. The pressure-sensitive switch according to claim 1, wherein each of the at least two elastic components includes a resin structure and a conductive layer formed along a protruding outline or a contour shape of the resin structure.

4. The pressure-sensitive switch according to claim 1, wherein each of the at least two elastic components extends to protrude from the electrode layer substantially perpendicularly toward the electrode unit.

5. The pressure-sensitive switch according to claim 4, wherein each of the at least two elastic components has a columnar or conical shape.

6. The pressure-sensitive switch according to claim 1, wherein, of the at least two elastic components, the higher elastic component has a relatively larger projection cross-sectional area.

7. The pressure-sensitive switch according to claim 1, wherein the at least two elastic components extend in a continuous form from the electrode layer.

8. The pressure-sensitive switch according to claim 7, wherein the at least two elastic components are provided in a grid-like manner on the electrode layer.

9. The pressure-sensitive switch according to claim 1, wherein the first substrate has flexibility.

10. The pressure-sensitive switch according to claim 1, wherein the first substrate, the electrode layer, the at least two elastic components, the electrode unit, and the second substrate are transparent to light in a visible region.

11. The pressure-sensitive switch according to claim 1, wherein the conductive structure has an integral structure of the at least two elastic components and the electrode layer.

12. A touch panel comprising:
   a sensor that detects a touch location; and
   a pressure-sensitive switch disposed on the sensor, the pressure-sensitive switch comprising:
   a first substrate;
   a conductive structure provided on the first substrate;
   a second substrate; and
   an electrode unit disposed to face the first substrate with the conductive structure located therebetween,
   wherein the conductive structure includes an electrode layer on the first substrate, and at least two elastic components having conductivity and extending to protrude from the electrode layer toward the electrode unit, and
   the at least two elastic components are spaced from each other and have different heights.

13. A manufacturing method for a pressure-sensitive switch, the manufacturing method comprising the steps of:
   providing a conductive structure by forming an electrode layer on a first substrate, and by forming at least two elastic components each that have conductivity and that protrude from the electrode layer; and
   providing an electrode unit that is positioned to face the at least two elastic components, wherein
   the at least two elastic components have different heights in the step of providing the conductive structure.

14. The manufacturing method for the pressure-sensitive switch according to claim 13, wherein, of the at least two elastic components, the higher elastic component has a relatively larger projection cross-sectional area.

15. A manufacturing method for a touch panel, the manufacturing method comprising the steps of:
   forming a sensor that detects a touch location; and
   providing, on the sensor, the pressure-sensitive switch that is obtained by the manufacturing method according to claim 13.

* * * * *